(12) United States Patent
Jang

(10) Patent No.: US 7,224,011 B2
(45) Date of Patent: May 29, 2007

(54) IMAGE SENSORS AND METHODS OF MANUFACTURING THE SAME

(75) Inventor: Hoon Jang, Cheongju-Si (KR)

(73) Assignee: Dongbu Electronics, Co. Ltd., Seoul (KR)

( * ) Notice: Subject to any disclaimer, the term of this patent is extended or adjusted under 35 U.S.C. 154(b) by 0 days.

(21) Appl. No.: 10/744,189

(22) Filed: Dec. 23, 2003

(65) Prior Publication Data

US 2004/0135065 A1    Jul. 15, 2004

(30) Foreign Application Priority Data

Dec. 31, 2002  (KR)  .................. 10-2002-0087900

(51) Int. Cl.
*H01L 31/062* (2006.01)
(52) U.S. Cl. ............... 257/292; 257/184; 257/187; 257/192; 257/293; 257/461; 257/509
(58) Field of Classification Search ............... 527/184, 527/187, 192, 292, 293, 461, 509
See application file for complete search history.

(56) References Cited

U.S. PATENT DOCUMENTS 5,859,450 A * 1/1999 Clark et al. .............. 257/233
6,118,142 A * 9/2000 Chen et al. ............... 257/232
6,350,127 B1   2/2002 Chiang et al.
6,352,876 B1 * 3/2002 Bordogna et al. ........... 438/69
6,372,603 B1   4/2002 Yaung et al.
6,495,391 B1  12/2002 Chan
6,507,059 B2   1/2003 Chen et al.
6,583,484 B2   6/2003 Pan et al.
6,607,951 B2 * 8/2003 Chen et al. ............... 438/199

FOREIGN PATENT DOCUMENTS

JP        2000031525       1/2000

\* cited by examiner

*Primary Examiner*—Wai-Sing Louie
(74) *Attorney, Agent, or Firm*—Saliwanchik, Lloyd & Saliwanchik

(57) ABSTRACT

Image sensors and methods of manufacturing an image sensor are disclosed. A disclosed photo diode may receive short wavelength light in its depletion region without exhibiting defective phenomenon such as noise and dark current. In the illustrated example, this performance is achieved by forming a trench type light-transmission layer to occupy a major surface of the photo diode so as to reduce the area available for defects on the surface of the semiconductor substrate. As a result of this reduction, the depletion region formed upon the operation of the sensor may extend toward the surface of the semiconductor substrate without concern for defects. The image sensor may be manufactured without forming a blocking layer in connection with a silicide layer.

7 Claims, 4 Drawing Sheets

ND METHODS OF
IMAGE SENSORS AND METHODS OF MANUFACTURING THE SAME

CROSS-REFERENCE TO RELATED APPLICATION

The entire disclosure of Korean Patent Application No. 10-2002-0087900 filed on Dec. 31, 2002 is incorporated herein by reference in its entirety.

FIELD OF THE DISCLOSURE

The present invention relates to a method of manufacturing an image sensor, and more particularly to a method of manufacturing an image sensor in which a trench type light-transmission layer occupying a major surface of a photo diode is formed on an active region of a semiconductor substrate and a lightly doped impurity layer is spread under the semiconductor substrate around the trench type light-transmission layer so as to improve the quality of the finished image sensor through an interworking operation therebetween. Also, the present invention relates to an image sensor manufactured by the method of manufacturing the image sensor.

BACKGROUND

Recently, with the rapid development of the electric/electronic technologies, various electronic devices (e.g., video cameras, digital still cameras, minicams adapted to personal computers (PC), minicams adapted to mobile phones, etc.), employing image sensor technologies have been widely developed and used.

In the conventional devices as described above, a charge coupled device (CCD) has generally been used as the image sensor. However, the CCD has drawbacks. For example, the CCD requires high driving voltage, and separate additional support circuitry. Further, the CCD has high per-unit prices. As a result of these drawbacks, usage of CCDs has been on the decline recently.

Recently, Complementary Metal Oxide Semiconductor (CMOS) image sensors have attracted attention as an image sensor which overcomes the disadvantages of the CCD. Since the CMOS image sensor is manufactured based on a series of CMOS circuit technologies, contrary to the existing CCD, The CMOS image sensor is advantageous in that it can be driven with low voltage, it does not require additional support circuitry, it has a low per-unit price and so on.

For example, prior art CMOS image sensors are described in U.S. Pat. No. 6,583,484 entitled "Method of manufacturing photo diode CMOS image sensor", U.S. Pat. No. 6,507,059 entitled "Structure of a CMOS image sensor", U.S. Pat. No. 6,495,391 entitled "Invention for reducing dark current of CMOS image sensor with new structure", U.S. Pat. No. 6,372,603 entitled "Photo diode with tightly-controlled junction profile for CMOS image sensor with STI process", U.S. Pat. No. 6,350,127 entitled "Method of manufacturing for CMOS image sensor", and Japanese Patent No. 2000-31525 entitled "Photo diode of image sensor and manufacturing method thereof."

As shown in FIG. 1, a conventional image sensor, (e.g., a CMOS image sensor), includes a photo diode 3 formed on an active region of a semiconductor substrate 1 defined by an element isolating layer 2 so as to generate and accumulate a series of photocharges through external incident light. It also includes a signal process transistor 10 disposed near the photo diode 3 so as to carry/discharge the photocharges generated and accumulated by the photo diode 3 toward an image processing circuit (not shown). In the illustrated example, the signal process transistor 10 includes, for example, a gate insulating layer pattern 11, a gate electrode pattern 12, a spacer 13 and an impurity layer 14.

In the example shown in the drawings, N type impurities (which are indicated as N+ in the drawing) of an impurity layer 3a for forming the photo diode 3 are relatively heavily doped compared with a P type semiconductor substrate 1. Thus, a depletion region (DR) formed upon the operation of the sensor is induced to extend inside the semiconductor substrate 1.

The reason why the DR is induced to extend inside the substrate 1 through the relatively heavy doping of the N type impurities compared with the P type semiconductor substrate 1 is as follows. If the N type impurities are relatively lightly doped compared with the P type semiconductor substrate 1 without a separate measure so that the DR formed upon the operation of the sensor is induced to extend toward the surface of the semiconductor substrate 1, various defects widely existing around a surface 1a of the semiconductor substrate (i.e., the surface of the photo diode) have bad effects upon the DR without a particular limit. Therefore, a finished photo diode operating in this fashion may exhibit various defective phenomena such as noise, dark current and so on.

In contrast, if the N type impurities are relatively heavily doped compared with the P type semiconductor substrate to induce the DR formed upon the operation of the sensor to extend inside the semiconductor substrate 1 as described above, the photo diode 3 must face the problem that light which cannot deeply penetrate the semiconductor substrate due to its short wavelength, (e.g., blue light), cannot normally be received in the DR. As a result, the finished image sensor has a greatly reduced ability to reproduce colors of short wavelength (e.g., blue) light.

Meanwhile, as shown in the drawing, a silicide layer 15 is additionally formed on a part of the signal process transistor 10. For example, the silicide layer 15 may be formed on the surfaces of the gate electrode pattern 12 and the impurity region 14 so as to improve a contact quality thereof.

However, if separate measures are not taken, the various defects caused by the formation of the corresponding silicide layer 15 are widely generated on the surface 1a of the semiconductor substrate 1. That is, if the formation process for the silicide layer 15 is forcedly performed in the state where the surface 1a of the semiconductor substrate 1 is exposed without any separate covering means, damage will widely occur on the surface 1a of the semiconductor substrate 1 by various processing shocks applied during the formation process for the silicide layer 15.

In order to resolve such problems, in the prior art as shown in the drawing, a blocking layer 4 is previously formed on the surface 1a of the semiconductor substrate 1 so as to prevent damage on the surface 1a of the semiconductor substrate 1 caused by the formation of the silicide layer 15 through a function of the blocking layer 4. However, while damage to the semiconductor substrate 1 caused by the formation of the silicide layer 15 may be prevented in some degree by the blocking layer 4, other damage caused by the formation of the blocking layer 4 will necessarily be generated on the surface 1a of the semiconductor substrate 1, which greatly degrades a characteristic of the photo diode.

Furthermore, image sensor manufacturers face not only the degradation of the characteristic of the photo diode 3 due to the formation of the blocking layer 4, but also the reduction in the overall process efficiency inherent in the inclusion of an additional step to form the blocking layer 4.

BRIEF DESCRIPTION OF THE DRAWINGS

In the following description and drawings, the same reference numerals are used to designate the same or similar components, and so repetition of the description of the same or similar components will be omitted.

DETAILED DESCRIPTION

Figure 1:
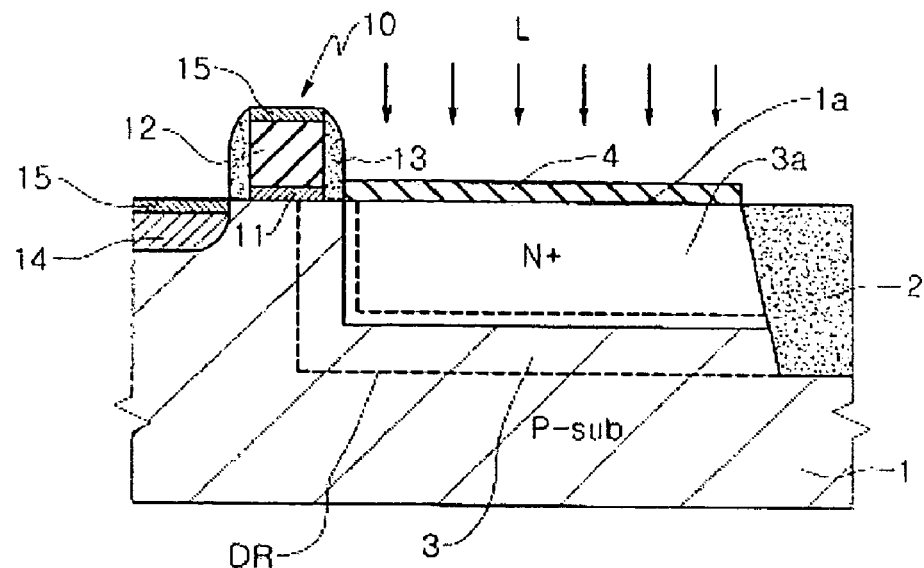
FIG. 1 is an end view of an example prior art image sensor.
Figure 2:
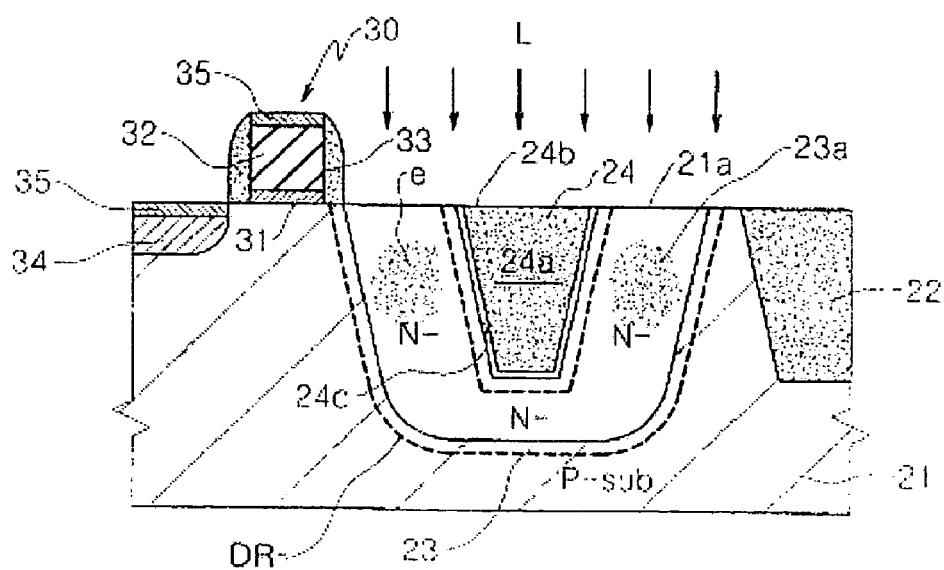
FIG. 2 is an end view of an example image sensor constructed in accordance with the teachings of the present disclosure.

As shown in FIG. 2, an example image sensor includes a photo diode 23 formed on an active region of a semiconductor substrate 21 defined by an element isolating layer 22 so as to generate and accumulate a series of photocharges through external incident light L. The example image sensor also includes a signal process transistor 30 disposed near the photo diode 23 so as to carry/discharge the photocharges generated and accumulated by the photo diode 23 toward an image processing circuit (not shown). In the illustrated example, the signal process transistor 30 includes, for example, a gate insulating layer pattern 31, a gate electrode pattern 32, a spacer 33 and an impurity layer 34.

In the illustrated image sensor, a light-transmission layer 24 is embedded in the active region of the semiconductor substrate 21, (e.g., in a formation region of the photo diode 23 of the semiconductor substrate 21). The light-transmission layer 24 is embedded and formed using a trench 24a recessed under the semiconductor substrate 21 to a certain depth as a bottom. An impurity layer 23a, (preferably, an N type impurity layer), for forming the photo diode 23 is disposed under the semiconductor substrate 21 around the light-transmission layer 24. In the illustrated example, the light-transmission oxide layer forming the light-transmission layer 24 is selected from any one of an Undoped Silicate Glass (USG) layer, a Boron Silicate Glass (BSG) layer, a Phosphorus Silicate Glass (PSG) layer, a Boron-Phosphorus Silicate Glass (BPSG) layer, a Tetra Ethyl Ortho Silicate (TEOS) layer and a High Density Plasma (HDP) Oxide layer. In the illustrated example, a buffer oxide layer 24c is additionally disposed on an etching face of the trench 24a so as to improve an adhesive property of the light-transmission layer 24 to the trench 24a.

In the illustrated example, a concentration of the impurities forming the impurity layer 24 (e.g., N type impurities) is maintained at a level that is lower than that of the semiconductor substrate 21, (e.g., the P type semiconductor substrate (indicated as N− in the drawing)). In this case, a depletion region (DR) formed upon the real operation of a sensor naturally extends toward the surface of the semiconductor substrate 21.

In the prior art as described above, N type impurities for forming the photo diode are relatively heavily doped compared with the P type semiconductor substrate so that the depletion region (DR) formed upon the operation of sensor is induced to extend inside the semiconductor substrate. This approach is followed in the prior art because, if the N type impurities are relatively lightly doped compared with the P type semiconductor substrate without a separate measure so that the DR formed upon the operation of sensor is induced to extend toward the surface of the semiconductor substrate, various defects widely existing around the surface of the semiconductor substrate will have bad effects upon the DR, so that a finished photo diode may exhibit various defective phenomena such as noise, dark current and so on.

Of course, prior art photo diodes can prevent these defective phenomenon (e.g., noise, dark current and so on) to some degree, but the photo diode must face the problem that short wavelength light (e.g., blue light) which cannot deeply penetrate the semiconductor substrate cannot be normally received in the DR. Thus, these prior art image sensors exhibit a greatly reduced ability to reproduce short wavelength colors.

In contrast, in the example disclosed herein, since the light-transmission layer 24 (consisting of, for example, the light-transmission oxide layer), is embedded and formed in the formation region of the photo diode 23 of the semiconductor substrate 21 so that a major surface 21a of the semiconductor substrate 21 corresponding to the photo diode 23 can be replaced with a surface 24b of the light-transmission layer 24, a defect area of the surface 21a of the semiconductor substrate can be naturally reduced in proportion to an occupying area of the light-transmission layer 24. As a result, as described above, even if the N type impurities are relatively lightly doped compared with the P type semiconductor substrate 21 so that the DR formed upon the operation of the sensor extends toward the surface of the semiconductor substrate, various defects existing around the surface 21a of the semiconductor substrate 21 cannot have any significant bad effect upon the DR. As a result, a finished photo diode 23 may be advantageous in that various defective phenomena such as noise, dark current and so on will not be caused while the DR is extending toward the surface of the semiconductor substrate 21.

Moreover, since the DR extends toward the surface 21a of the semiconductor substrate 21, the photo diode 23 can normally receive even short wavelength light, (e.g., blue light), which cannot deeply penetrate the semiconductor substrate 21 in its DR. As a result, the DR may normally generate and accumulate the photocharges. Consequently, the finished image sensor may achieve an increased ability to reproduce short wavelength colors such as blue light.

As shown in the drawings, in the illustrated example the N type impurity layer 23a forming a base of the DR surrounds the light-transmission layer 24 longitudinally and horizontally while maintaining its concentration at a lower level. As a result of this structure, when the full-scale operation of the sensor is performed, the DR longitudinally and horizontally surrounds the light-transmission layer 24 corresponding to the shape of the N type impurity layer 23a and also encroaches on the majority of the N type impurity layer 23a as well, thereby greatly increasing its expansion area compared with the prior art.

As a result, the illustrated photo diode 23 is advantageous in that it can normally receive blue light with short wavelength in its DR and its effective area (i.e., its DR) that is reactive with light is enlarged. Moreover, a finished image sensor would have an increased ability to reproduce short wavelength colors such as blue light.

Moreover, as shown in the drawings, a silicide layer 35 is additionally formed on a part of the signal process transistor 30, (for example, on the surfaces of the gate electrode pattern 32 and the impurity layer 34), so as to improve a contact quality thereof.

As described above, in the prior art a blocking layer 4 has been formed so as to prevent damage to the surface of the semiconductor substrate caused by the formation of the silicide layer. However, when the blocking layer 4 is formed on the surface of the semiconductor substrate, the manufacturers necessarily encounter the problems of degradation in the characteristic of the photo diode and degradation in process efficiency as discussed above.

In contrast, in the illustrated example, since the light-transmission layer 24 (consisting of, for example, the light-transmission oxide layer), is widely embedded and formed in the formation region of the photo diode 23 of the semiconductor substrate 21, even if the formation process for the silicide layer 35 is forcedly performed without forming a blocking layer on the semiconductor substrate side (i.e., the photo diode), because of the protective function of the light-transmission layer 24, the semiconductor substrate side will not incur any separate damage. As a result, the manufacturers can attain the effect of normally protecting the semiconductor substrate (i.e., the photo diode) without actually forming the blocking layer. Therefore, if the additional formation process for the blocking layer concerned with the silicide layer is excluded from the overall process, manufacturers can avoid the problems of degradation in the characteristic of the photo diode and degradation in the process efficiency which would have been caused by the formation of the blocking layer.

Hereinafter, an example method of manufacturing the image sensor as described above will be explained in detail.

The example method of manufacturing the image sensor shown in FIGS. 3a to 3f comprises: embedding the light-transmission layer 24 in the active region AR of the semiconductor substrate 21; ion-implanting impurities to form the impurity layer 23a for the photo diode 23 spread under the semiconductor substrate 21 while surrounding the light-transmission layer 24; and forming the signal process transistor 30 for carrying/discharging photocharges accumulated in the photo diode 23.

Figure 3A:
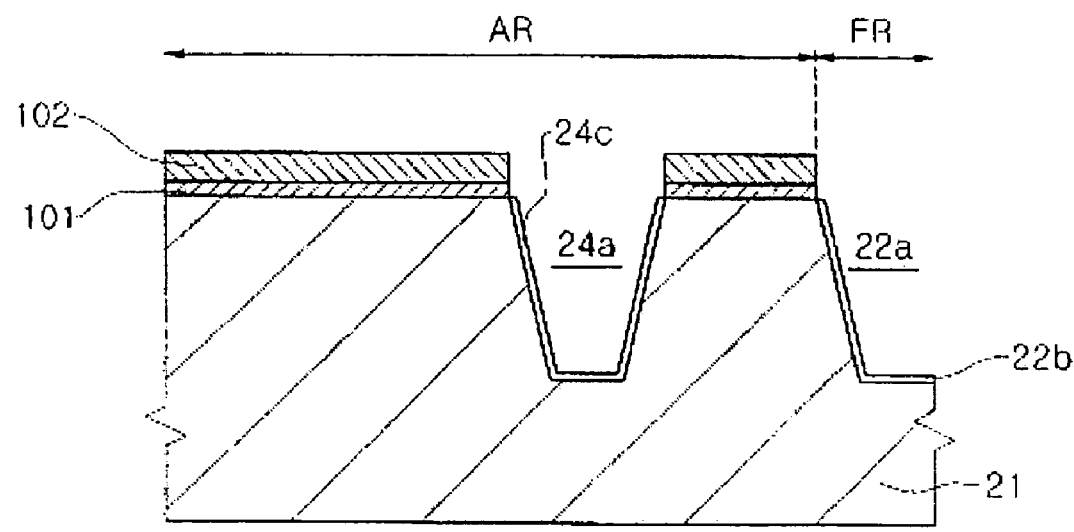
FIGS. 3a to 3f illustrate an example method of manufacturing an image sensor in accordance with the teachings of the present disclosure.

First, as shown in FIG. 3a, by performing a high temperature thermal oxidation process, a sacrificial oxide layer 101 (whose thickness is, for example, about 40~150 Å) is grown on the front face of the semiconductor substrate 21. The sacrificial oxide layer 101 serves to relieve the stress on the semiconductor substrate 21 caused by a sacrificial nitride layer 102 to be formed later.

Then, by performing a low pressure chemical vapor deposition (CVD) process, the sacrificial nitride layer 102 (whose thickness is, for example, about 600~1500 Å) is formed on the sacrificial oxide layer 101. The sacrificial nitride layer 102 serves as a mask layer at the time of the formation of the trench 22a and 24a to be described below, and as an etch stopper layer during a chemical mechanical polishing (CMP) process.

Next, a photoresist pattern (not shown) is formed on the sacrificial nitride layer 102 so that openings of the photoresist pattern are positioned at a part of the active region AR and at a part of an inactive region FR of the semiconductor substrate 21. The sacrificial oxide layer 101 and the sacrificial nitride layer 102 are then patterned to expose a part of the active region AR and the inactive region FR of the semiconductor substrate 21 by performing a dry etching process with an anisotropic feature, (e.g., a reactive ion etching (RIE) process using the photoresist pattern as en etching mask). The photoresist pattern is then removed.

Subsequently, by performing, for example, the RIE process using the remaining sacrificial nitride layer 102 as an etching mask, a part of the exposed portion of the active region AR and the inactive region FR of the semiconductor substrate 21 is anisotropically etched to a certain depth. As a result, the trenches 22a and 24a are formed in a part of the active region AR and the inactive region FR of the semiconductor substrate 21. The trench 22a serves as a base of an element isolating layer 22 in the inactive region FR. The element isolation layer 22 provides element isolation. The trench 24a serves as a base of the light-transmission layer 24 in the active region AR. The trench 24a improves the photo diode's characteristics.

Once the trenches 22a and 24a have been completely formed through the foregoing procedure, a thermal oxidation process is performed at, for example, about 800~900° C. to grow the buffer oxide layers 22b and 24c (having a thickness of, for example, 100~400 Å), on the etching faces of the trenches 22a and 24a as shown in FIG. 3a. The buffer oxide layers 22b and 24c serve to facilitate adhesion of the light-transmission layer 24, (to be formed later), to the etching faces of the trenches 22a and 24a and also serve to recover the damaged silicon lattices remaining in the etching faces of the trenches 22a and 24a.

Figure 3B:
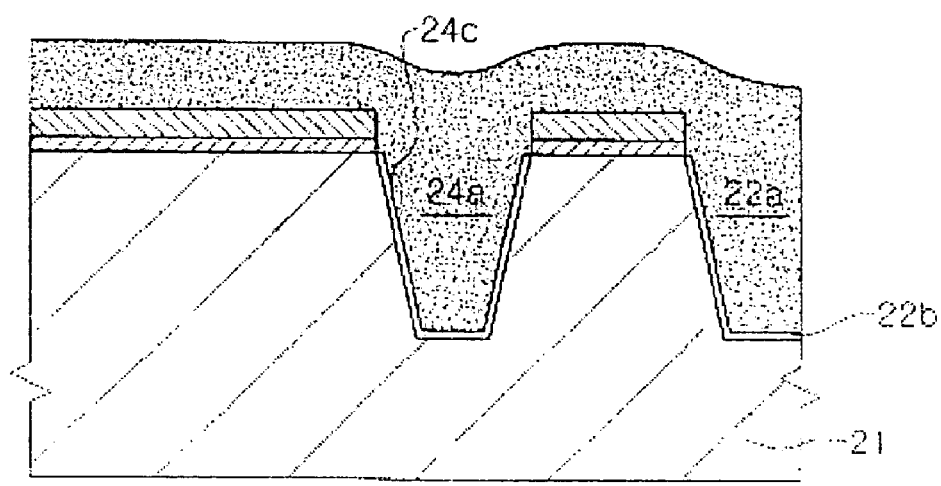

Once the buffer oxide layers 22b and 24c have been completely grown through the foregoing procedure, by selectively performing, for example, a TEOS process, an APCVD process, a PECVD process or an HDP CVD process, inner portions of the trenches 22a and 24a are filled with a thick oxide layer S so as to cover the sacrificial nitride layer 102 as shown in FIG. 3b. The thick oxide layer S may be, for example, a USG layer, a BSg layer, a PSg layer, a BPSg layer, a TEOS layer or an HDP oxide layer, etc.

Then, by performing the CMP process, the oxide layer S formed on the sacrificial nitride layer 102 is planarized. The sacrificial nitride layer 102 serves as an etch stopper layer of the oxide layer S as described above.

Then, by performing the thermal process at a high temperature (for example, about 800~1200° C.), the oxide layer S is densified so that an insulation characteristic of the oxide layer S is enhanced.

Figure 3C:
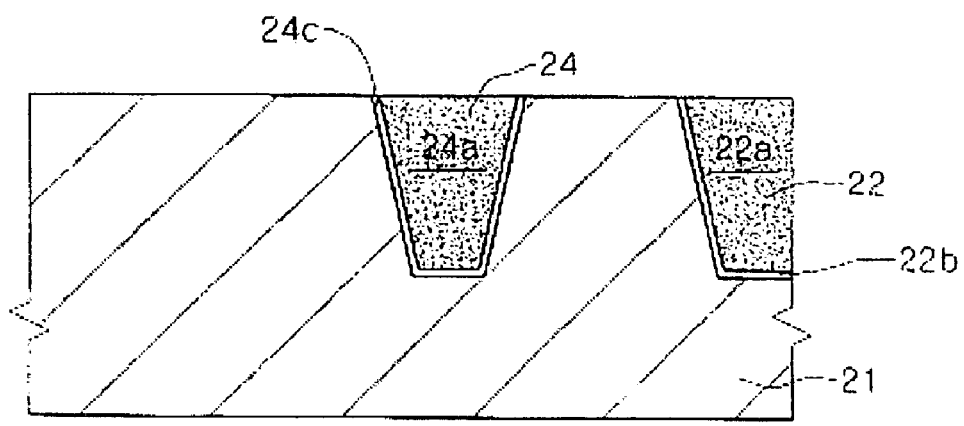

Subsequently, by performing a wet etching process using phosphoric acid solution, the sacrificial nitride layer 102 is isotropically etched. By performing a wet etching process using HF solution, the sacrificial oxide layer 101 and the remaining oxide layer S are isotropically etched so as to expose the surface of the semiconductor substrate 21 as shown in FIG. 3c. At this point, the light-transmission layer 24 and the element isolating layer 22 have been completely embedded in the trenches 22a and 24a.

Figure 3D:
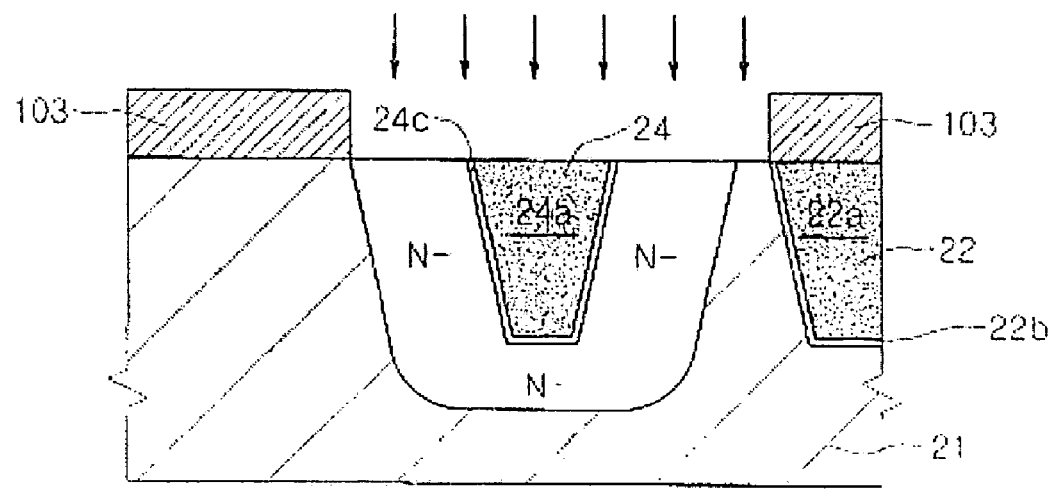

Once the light-transmission layer 24 has been completely embedded in the trenches 22a and 24a through the foregoing procedure, as shown in FIG. 3d, a photoresist pattern 103 is formed on the semiconductor substrate 21. An opening of the photoresist pattern is positioned at a part of the active region AR of the semiconductor substrate 21, (for example, a predetermined portion of the photo diode 23). By performing an implantation process of impurities using the photoresist pattern 103 as a mask, the impurity layer 23a for the photo diode 23 is formed. The impurity layer 23a is spread under the semiconductor substrate 21 while surrounding the light-transmission layer 24. The photoresist pattern 103 is then removed.

The level of concentration of the impurities, (for example, N type impurities), forming the impurity layer 23a is maintained lower than that of the P type semiconductor substrate 21. As a result, the DR formed at the time of the operation of the sensor extends toward the surface 21a of the semiconductor substrate 21.

Figure 3E:
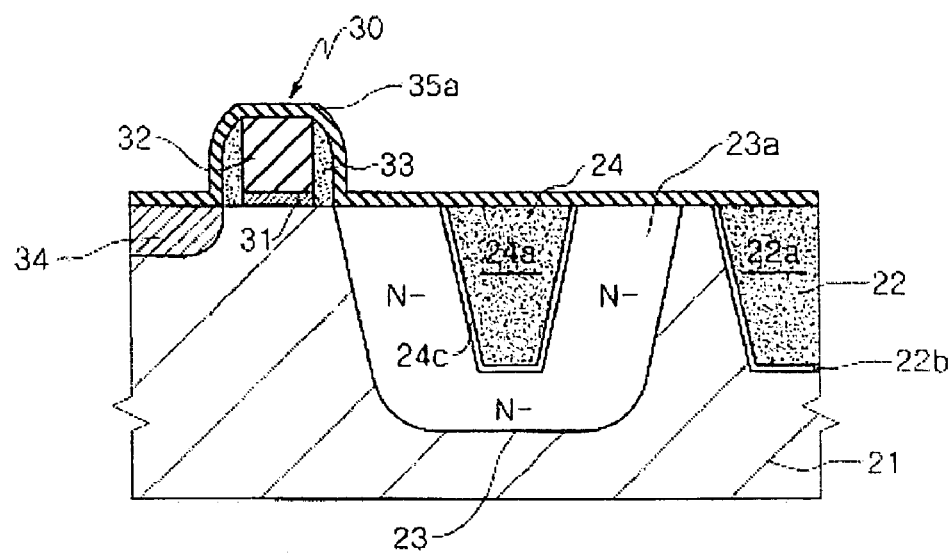

Then, by selectively performing the thermal oxidation process, low pressure CVD process and so on, the gate insulating layer is formed on the front face of the semiconductor substrate 21. Then by additionally performing the low pressure CVD process, a poly crystal silicon layer is formed on the gate insulating layer. Thereafter, by performing a photolithography process, the gate insulating layer and the poly crystal silicon layer are patterned together so that, as shown in FIG. 3e, the gate insulating layer pattern 31 and the gate electrode pattern 32 are formed in the active region of the semiconductor substrate 21, (i.e., near the photo diode 23).

Then, by performing the low pressure CVD process, an insulating layer covering the gate electrode pattern 32 is formed on the front face of the semiconductor substrate 21. By performing a dry etching process with an anisotropic etching feature on the insulating layer, (for example, an RIE process), a spacer 33 is formed on the sidewalls of the gate electrode pattern 32.

Then, by performing an ion implantation with high concentration using the spacer 33 as a buffer mask, the impurity layer 34 is formed on the side of the gate electrode pattern 32. The formation of the impurity layer 34 completes the formation of a finished signal process transistor 30 for carrying/discharging the photocharges accumulated in the photo diode 23.

Of course, even though it is not shown in the drawings, persons of ordinary skill in the art will appreciate that the signal process transistor 30 illustrated in the drawings can be disposed at many sites of the semiconductor substrate 21.

By performing, for example, a sputtering process, a thin metal layer 35a, (e.g., a Ti layer), for forming a silicide layer is formed on the front face of the semiconductor substrate 21 (including the gate electrode pattern 32, the spacer 33, and the impurity layer 34).

Figure 3F:
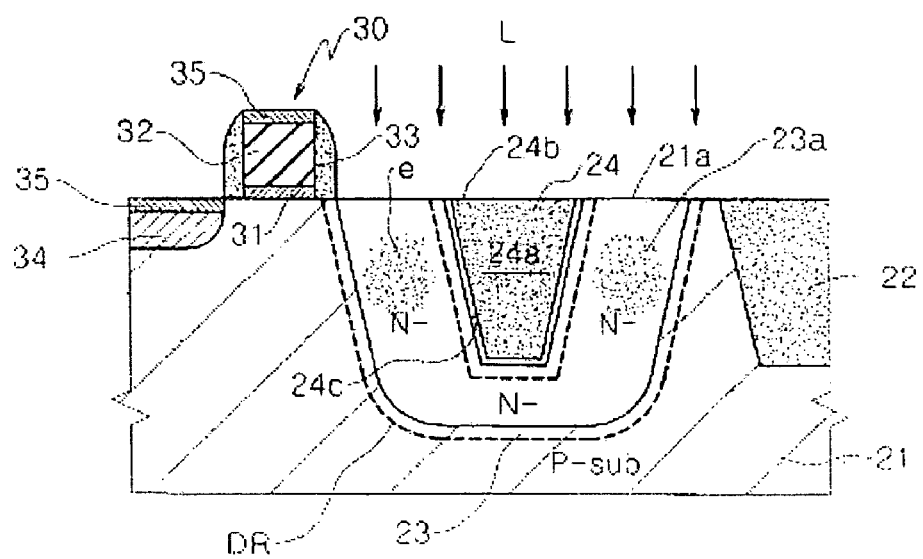

Then, by performing a thermal process on the semiconductor substrate 21, the metal atoms forming the thin metal layer 35a and the silicon atoms forming the semiconductor substrate 21 are reacted with each other. As a result, the silicide layer 35 made of, for example, $SiTi_x$, is formed on the surface of the impurity layer 34 and the gate electrode pattern 32 as shown in FIG. 3f.

In contrast to the prior art, since the light-transmission layer 24 of the illustrated example is widely embedded and formed in the formation region of the photo diode 23 of the semiconductor substrate 21, even if the formation process for the silicide layer 35 is forcedly performed without forming a blocking layer on the semiconductor substrate side (i.e., the photo diode), because of the protective function of the light-transmission layer 24, the semiconductor substrate side is not damaged. As a result, manufacturers can attain the benefit of protecting the semiconductor substrate (i.e., photo diode) without additionally forming the blocking layer.

Then, by performing subsequent processes (e.g., the formation processes for the insulating layer, the contact hole, the metallization, the interlayer dielectric, the color pattern, the planarized layer, the micro lens array and so on), a finished image sensor is completely manufactured.

As described above, a finished photo diode has been disclosed that may receive short wavelength (e.g., blue) light in its depletion region without defective phenomenon such as noise, dark current and so on. The disclosed photo diode achieves this result by forming a trench type light-transmission layer occupying a major surface of the photo diode on the active region of the semiconductor substrate so as to reduce an area available for defects on the surface of the semiconductor substrate so that the depletion region formed upon the operation of the sensor may extend toward the surface of the semiconductor substrate irrespective of defects.

The problems of degradation in the characteristic of the photo diode and degradation in processing efficiency caused by an additional formation process for a blocking layer used in connection with the formation of the silicide layer are avoided by forming a trench type light-transmission layer stably protecting the depletion region and excluding the additional formation process for the blocking layer.

From the foregoing, persons of ordinary skill in the art will appreciate that the above disclosed methods and apparatus provide a finished photo diode that receives short wavelength light (e.g., blue light) in its depletion region without defective phenomenon such as noise, dark current, etc. The illustrated methods and apparatus achieve this by forming a trench type light-transmission layer occupying a major surface of a photo diode in an active region of a semiconductor substrate so as to reduce the area which may be occupied by defects on the surface of the semiconductor substrate. The depletion region formed upon the operation of a sensor may, thus, extend toward the surface of the semiconductor substrate without fear of defects.

The illustrated methods and apparatus also avoid degradation of a characteristic of the photo diode and degradation in processing efficiency which are caused in the prior art by performing an additional formation process to create a blocking layer. The illustrated methods and apparatus achieve these advantages by forming a trench type light-transmission layer that stably protects a depletion region formed upon the operation of the sensor on a photo diode region of a semiconductor substrate without forming a blocking layer in connection with the silicide layer.

A disclosed image sensor includes: a light-transmission layer embedded and formed on an active region of a semiconductor substrate; an impurity layer in the semiconductor substrate and surrounding the light-transmission layer so as to form a photo diode for the generation/accumulation of photocharges; and signal process transistor for carrying/discharging the photocharges accumulated in the photo diode.

Preferably, the light-transmission layer is embedded and formed in an active region using a trench recessed under the semiconductor substrate as a bottom. Preferably, the light-transmission layer is formed of a light-transmission oxide layer including any one of an Undoped Silicate Glass (USG) layer, a Boron Silicate Glass (BSG) layer, a Phosphorus Silicate Glass (PSG) layer, a Boron-Phosphorus Silicate Glass (BPSG) layer, a Tetra Ethyl Ortho Silicate (TEOS) layer and a High Density Plasma (HDP) Oxide layer.

In the illustrated example, the impurities forming the impurity layer are N type impurities whose concentration level is maintained lower than that of the semiconductor substrate.

A disclosed method of manufacturing an image sensor comprises embedding a light-transmission layer in an active region of a semiconductor substrate; ion-implanting impurities to form an impurity layer for a photo diode in the semiconductor substrate and surrounding the light-transmission layer; and forming a signal process transistor for carrying/discharging photocharges accumulated in the photo diode.

Preferably, embedding the light-transmission layer comprises forming a sacrificial layer pattern on a part of the semiconductor substrate; etching the active region of the semiconductor substrate to a certain depth using the sacrificial layer pattern as a mask to form a trench; forming the light-transmission layer on the semiconductor substrate to cover the sacrificial layer pattern and the trench; and selectively removing the light-transmission layer using the sacrificial layer pattern as a mask to leave the light-transmission layer only in the trench.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An image sensor comprising:
   a light-transmission layer embedded and formed in an active region of a semiconductor substrate, wherein a trench recessed in the semiconductor substrate is used as a bottom for the light-transmission layer;
   an impurity layer in the active region of the semiconductor substrate and substantially surrounding the light-transmission layer except the top surface of the light-transmission layer to form a photo diode, wherein the photo diode has a shape of a trench in which the light-transmission layer is situated; and
   a signal process transistor to carry/discharge photocharges accumulated in the photo diode.

2. An image sensor as defined in claim 1, wherein the light-transmission layer is comprises a light-transmission oxide layer.

3. The image sensor as defined in claim 2, wherein the light-transmission oxide layer is any one of an Undoped Silicate Glass (USG) layer, a Boron Silicate Glass (BSG) layer, a Phosphorus Silicate Glass (PSG) layer, a Boron-Phosphorus Silicate Glass (BPSG) layer, a Tetra Ethyl Ortho Silicate (TEOS) layer and a High Density Plasma (HDP) Oxide layer.

4. The image sensor as defined in claim 1, wherein the impurity layer is formed by N type impurities.

5. An image sensor as defined in claim 1, wherein a concentration level of impurities forming the impurity layer is lower a concentration level of impurities forming the semiconductor substrate.

6. The image sensor as defined in claim 1, wherein the impurity layer is in contact five faces of the light-transmission layer.

7. The image sensor as defined in claim 1, further comprising a buffer oxide layer formed between the light-transmission layer and the photo diode.

* * * * *